United States Patent [19]

Hotta et al.

[11] Patent Number: 4,803,440

[45] Date of Patent: Feb. 7, 1989

[54] AUTOMATIC ELECTRICAL POWER CONTROL CIRCUIT

[75] Inventors: Toshinori Hotta; Osamu Yamamoto, both of Tokyo, Japan

[73] Assignee: NEC Corporation, Japan

[21] Appl. No.: 97,845

[22] Filed: Sep. 16, 1987

[30] Foreign Application Priority Data

Sep. 25, 1986 [JP] Japan .................. 61-227047

[51] Int. Cl.$^4$ ............................................. H03G 3/20
[52] U.S. Cl. ...................................... 330/145; 330/284
[58] Field of Search ............... 330/129, 138, 144, 145, 330/280, 284; 455/249

[56] References Cited

U.S. PATENT DOCUMENTS 4,523,155 6/1985 Walczak et al. ................... 330/279

FOREIGN PATENT DOCUMENTS 176303 4/1986 European Pat. Off. .
143624 4/1982 Japan .
182209 9/1985 Japan ................................. 330/138
173507 5/1986 Japan .

Primary Examiner—James B. Mullins
Attorney, Agent, or Firm—Laff, Whitesel, Conte & Saret

[57] ABSTRACT

A power control circuit comprises a signal input, a controllable attenuator, an amplifier, an output, a power detector, a reference circuit, a comparator, an external control input, an error detector, and a controller. The comparator, error detector, and controller are digital circuits realized by a microprocessor. The attenuator is between the signal input and the input to the amplifier to regulate the amplifier's output. The power detector couples to the amplifier output to generate a measurement signal representing the power at the output. The reference circuit generates a reference signal representing a predetermined minimum output when the signal input is nonzero. The comparator compares the measurement and reference signals and generates a decision signal indicating if the signal input is nonzero. The external control input receives an external control signal. The error detector is coupled to the power detector and the external control input and computes the difference between the external control signal and the measurement signal. When the measurement signal is at or above the minimum power, the controller provides an integral of the computed difference to control the variable attenuator. When the measurement signal is below the minimum power, the controller keeps the attenuator at a prior constant value.

9 Claims, 4 Drawing Sheets

AUTOMATIC ELECTRICAL POWER CONTROL CIRCUIT

This invention relates to an automatic electric power control circuit for reducing fluctuations in the electrical power output of an amplifier circuit or the like, and more particularly, to a circuit suitable for automatically controlling the output power level of radio transmitters, such as those used in satellite communication systems, etc.

BACKGROUND

Prior art automatic power control circuits are typically constructed to input a tiny known fraction of the output signal from a power amplifier and compare its average amplitude against a predetermined reference value corresponding to the desired power level. A variable attenuator is provided in front of the power amplifier input to regulate the input signal level and is adjusted based on the result of such comparison. By using negative feedback to reduce or increase the attenuation of the signal input to the power amplifier, such a control circuit regulates the level of amplifier's output signal to maintain a predetermined power level.

Conventionally, the actual circuit used to realize this automatic control differs according to the type of radio signal being amplified. For example, in satellite radio communications, there are two main types of multichannel signal transmission formats. One is multiple carrier multiplex transmission, in which a single transmitter sends a plurality of carrier waves, each corresponding to a different channel. The other is packet transmission, in which signals are bundled in packets which are transmitted intermittently in bursts.

With multiple carrier transmission, because a single power amplifier amplifies a plurality of different carrier waves (common amplification), care must be taken to prevent cross modulation between the different carriers (channels). For example, NEC Corporation's Japanese Laid Open Patent Application Publication 143,624/82, entitled "Automatic Electrical Power Control Circuit," discloses a control circuit for a multiple carrier transmission power amplifier. This control circuit is constructed to have the desired output power level indicated by a control signal input from a source external to the power amplifier control circuit itself. This control circuit has a negative feedback loop in which the externally provided digital control signal is input to a digital-to-analog (D/A) converter to create an analog reference voltage.

A predetermined tiny fraction of the A.C. output from the power amplifier is rectified (detected) to derive a low frequency measured output signal. Then the difference between the measured output signal and the reference voltage is amplified by an analog differential amplifier. The amplified difference is then used as a correction signal to negative feedback control a variable attenuator regulating the signal input to the power amplifier.

But such a circuit would not work well with packet transmission, since the transmitted packet signal is generated in periodic or irregular intermittent bursts separated by intervals of no transmission signal. The "no signal" intervals would mislead such a power control into greatly reducing the variable attenuation, resulting in overamplification when the next transmission burst begins.

Instead, for packet signals the control circuit needs a HOLD circuit in the negative feedback loop to provide stability. For example, NEC Corporation's Japanese Laid Open Patent Application Publication 173,507/86, entitled "Automatic Level Control Circuit," shows a control circuit constructed from an analog comparator 6, which compares a local analog reference voltage 7 with a detected known fraction of the amplifier output, an up/down counter 8 which has a HOLD function, and a digital-to analog (D/A) converter 12 which converts the up/down counter's digital output into an analog signal to control a variable attenuator 13 regulating the input to the power amplifier. When the transmission signal is present, a clock pulse causes the up/down counter to count up or down depending on the output from the analog comparator 6. The D/A converter then regularly converts the changing counted value in the digital up/down counter into an analog correction signal suitable for controlling the variable attenuator.

If no transmission signal is present at the input, the clock pulse ceases and the up/down counter holds the count value which existed just prior to the loss of input signal. This retained digital count value is supplied to the D/A converter, which produces an analog signal for controlling the attenuator. Note that this circuit is not provided with an input terminal for an external power control signal.

Since satellite radio communications are generally adversely attenuated by rain, an automatic transmission control circuit for such applications must be able to automatically compensate for rain attenuation, regardless of whether the signal transmission format is multiple-carrier transmission or packet transmission. In other words, it is highly desirable for the control circuit to be able to set the output power level in response to an external signal, such as one indicating the onset of rain.

In recent years there has been a growing demand for small, low-cost earth stations for satellite communication (hereafter "small ground stations"). The equipment used in such small ground stations must be compact and economical. Because generally such stations use the packet transmission format, an automatic transmission power control circuit for them must not only be compact and economical. It must also operate stably when transmitting the burst signals of packet transmission and provide a terminal for an external power control signal.

Circuit designs using analog comparators along the lines of the previously mentioned prior art circuits have the disadvantage that they generally have to be constructed from a number of individual parts. Therefore, such circuits cannot easily be miniaturized and made less expensive.

OBJECTS OF THE INVENTION

Therefore, it is an object of the invention to provide a miniaturized and economical automatic power control circuit which can function in a stable manner even for burst signals and can be controlled by an external signal. A further object is to provide a versatile circuit that automatically adapts to both multiple-carrier transmission and packet transmission. Yet another object is to realize many component functions of such a versatile circuit with digital rather than analog techniques, enabling the use of commercially available microcomputer technology.

BRIEF SUMMARY OF THE INVENTION

A control circuit is provided for regulating the power amplification of communication signals. The circuit comprises an amplifying transmission path including a power amplifier, a controllable variable attenuator, an external power control input, an output power level detector, a threshold reference circuit, a threshold power comparator, an error detector, and an attenuator controller. The threshold power comparator, error detector, and attenuator controller are designed as digital circuits and therefore can be conveniently realized by a programed microcomputer, such as a microprocessor on a chip with onboard program and scratchpad memory.

The amplifying transmission path has an input for a communication signal and an output for the amplified version of the signal. The controllable attenuator is a variable attenuation circuit which regulates the signal input to the power amplifier, thereby controlling the signal power of the amplified communication signal at the amplifier's output.

The power level detector has a directional coupler coupled to the transmission path for generating a measurement signal representing the power of the amplified communication signal at the output. The threshold reference circuit is adapted to generate a predetermined threshold reference signal which represents a predetermined minimum signal power of the amplified communication signal at the output when a nonzero communication signal is fed to the input.

The threshold power comparator is for comparing the measurement and threshold reference signals, and generating a decision signal which indicates whether the measurement signal is at or above the minimum power. The external power control input is for inputting an external power control signal. The error detector is a subtractor circuit coupled to the power level detector and the external power control input. It determines the difference between the external power control signal and the measurement signal for use by the attenuator controller in computing a negative feedback correction signal.

When the comparator's decision signal indicates that the measurement signal is at or above the minimum power, the attenuator controller time integrates the difference determined by the error detector to produce a correction signal for controlling the variable attenuator. When the decision signal indicates that the measurement signal is below the minimum threshold, it is assumed that the input communication signal has temporarily ceased. The attenuator controller then holds and continues to output to the variable attenuator its most recent value before the communication signal ceased.

BRIEF DESCRIPTION OF THE DRAWINGS

The above mentioned and other features of the invention and the manner of obtaining them will become more apparent, and the invention itself will be best understood by reference to the following description of an embodiment of the invention, taken in conjunction with the accompanying drawings, in which.

DETAILED DESCRIPTION

Figure 1:
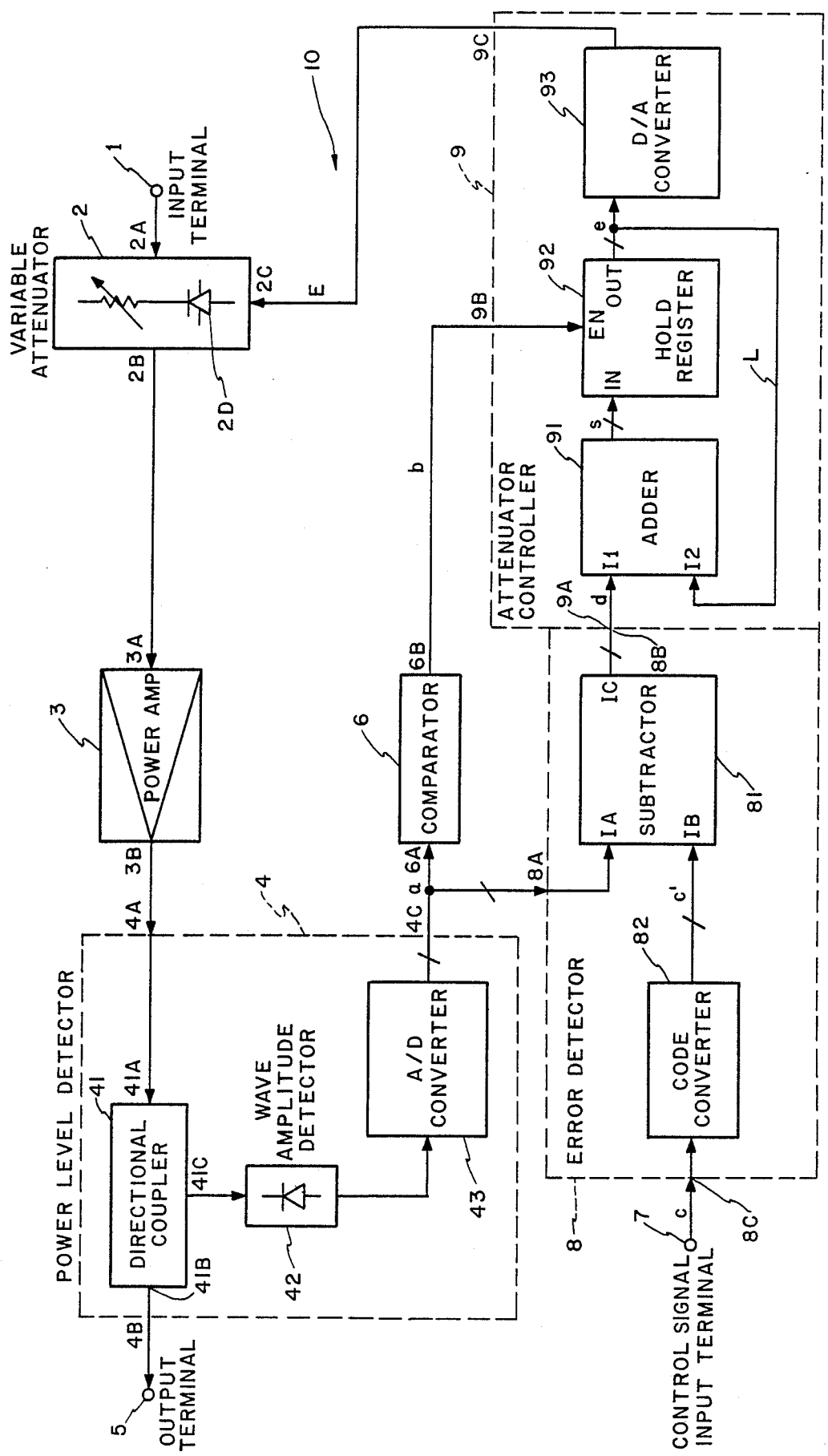
FIG. 1 is a functional block diagram of an embodiment of an automatic power control circuit according to the invention.
Figure 1A:
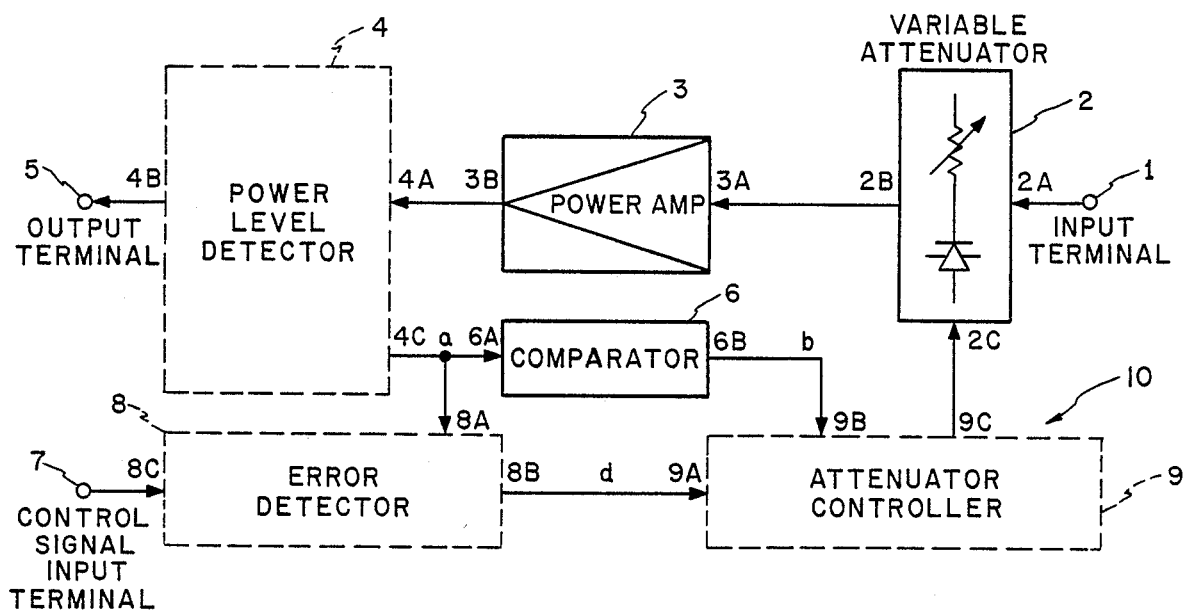
FIG. 1A is a simplified functional block diagram of the circuit of FIG. 1, showing its major components.

As shown in FIGS. 1 and 1A, the inventive automatic electrical power control circuit 10 has a signal input terminal 1 coupled to an input 2A of a variable attenuator 2, an output 2B of which is coupled to an input 3A of a power amplifier 3. A power detection circuit 4 is coupled between a power amplifier output 3B of amplifier 3 and a signal output terminal 5.

A comparator 6, which may be a digital comparator, compares a digitalized output "a" of power level detector 4 with an internally generated predetermined digital power reference signal. Based on this comparison, comparator 6 outputs at 6B a decision signal "b", preferably a binary signal, to input 9B of attenuator controller 9. An external control signal c is input at an input terminal 7 of an error detector 8. An attenuator controller is respectively controlled by the binary state of decision signal "b" (from comparator 6) and a digital difference signal "d" (from error detector 8). Attenuator controller 9 in turn outputs an analog feedback signal E for controlling variable attenuator 2.

The variable attenuator 2 is made, for example, from a commercially available PIN voltage controlled diode 2D. After attenuator 2 provides a certain amount of attenuation to the communication signal input at terminal 1, it sends the attenuated signal to power amplifier 3. The amount of attenuation by attenuator is determined by the analog correction output E of attenuator controller 9. The communications signal input at terminal 1 can be either a multiple carrier signal or an intermittent (periodic or irregular) packet burst signal.

As shown in FIG. 1, power amplifier 3 amplifies the attenuated signal (regulated to an appropriate level by variable attenuator 2) to deliver a certain desired output level to output terminal 5 via power level detector 4. Power level detector 4 comprises directional coupler 41, a wave amplitude detector 42, and an A/D converter 43. The directional coupler 41 divides off and outputs at 41C a predetermined tiny fraction of the output signal of power amplifier 3 to wave amplitude detector 42.

Wave amplitude detector 42 converts this predetermined tiny fraction of the output into a detected D.C. analog voltage, which is then digitalized by A/D converter 43 into a signal "a". Thus, measured digital power output signal "a" generated by power level detector 4 is a digital signal which corresponds to the actual power output level of power amplifier 3. The A/D converter 43 sends digital signal "a" to one of the input terminals 8A of error detector 8, and also to digital comparator 6. As can be seen in more detail in FIG. 1, the signal arriving at terminal 8A of detector 8 is input to one terminal IA of a subtractor 81. Subtractor 81 computes the difference (IB−IA) for its output IC.

Digital comparator 6 regularly compares the magnitude indicated by digitalized power output signal "a" with an internally predetermined digital threshold value. Based on the comparison, comparator 6 generates a binary digital decision signal "b" indicating whether a nonzero communications signal is being input to terminal 1. This decision signal "b" is input to an enable input EN of a holding register 92 of attenuator controller 9.

For example, if measured output signal "a" is equal to or greater than the predetermined threshold value, digital comparator 6 decides "YES" (input communication signal present) and sets the decision signal "b" to logical "1". But if measured power output signal "a" is less than the threshold, comparator 6 will decide "NO" (input communications signal not present) setting decision signal "b" to logical "0".

Therefore, if the signal at input terminal 1 is a burst signal, the decision signal b will be an ON-OFF signal which alternates between a "1" during transmission bursts and a "0" between transmissions.

A coded control signal c input at control terminal 7 is a predetermined external signal that sets the power output level of power amplifier 3. This power output control signal c is fed to code converter circuit 82 of error detector 8. Code converter 82 converts the coded external control signal c into an appropriate digitalized signal c' representative of the desired level power output and gives it to the other input terminal IB of a digital subtractor 81, enabling comparison with the measured power output signal "a" input to terminal IA of subtractor 81.

Subtractor 81 computes digital difference c'—a between its inputs, and outputs this difference as a digital error signal d to an input terminal 9A of attenuator controller 9. Within controller 9, error signal d is fed to a first input terminal I1 of a digital adder circuit 91. Signal d corresponds to the difference between the desired power level indicated by decoded signal c' (derived from coded external signal c) and the actual measured output of power amplifier 3 indicated by signal "a".

Attenuator controller 9 comprises input adder circuit 91, hold register 92, and an output digital-to-analog (D/A) converter 93. A digital signal e output from hold register 92 is fed back to terminal I2 of adder 91. Digital adder 91 computes the sum d+e of its inputs, and outputs this sum as a digital signal s to an input IN of hold register 92. If the decision signal at enable input EN of hold register 92 is "1" (input communication signal present), holding register 92 transfers the digital signal s from input IN to its output terminal OUT, where it becomes the register's digital output e. Because signal e is also fed back to input I2 of adder 91, adder circuit 91 and holding register 92 together operate as an integration circuit, sequentially cumulating the value of error signals d until signal decision signal b changes to a "0".

But if the decision signal b changes to a "0" (input communication signal not present), hold register 92 ignores the signal s at input IN. The output at terminal OUT of register 92 remains unchanged from its most recent value just before signal b changed from "1" to "0". Thus, adder 91 and hold register 92 cooperate to form a sample hold integration circuit whose state is determined by enable signal b. If b is logical "1", sequential integration of signal d takes place; if b is logical "0" the most recent value e of the integral is maintained at output OUT of register 92.

The digital output signal e output by hold register 92 controls the amount of attenuation of variable attenuator 2. It is converted to an analog correction signal E by a D/A converter 93 and input at 2C to control to variable attenuator 2.

When a communication signal is input to terminal 1, the measured output of power amplifier 3 is compared to the desired power level indicated by external control signal c, and any difference (error) is integrated to form the correction signal. If the output of power amplifier 3 is too small, the difference signal $d=(c'-a)$ will be positive, and the correction signal E will steadily increase, causing a corrective decrease in attenuation. On the other hand, if the output of power amplifier 3 is too large, the difference signal $d=(c'-a)$ will be negative, and the correction signal E will increase steadily decrease, causing a corrective increase in attenuation.

Thus, such a negative feedback loop automatically acts to eliminate fluctuations of power output. If the input at terminal 1 is a packet type signal and no burst signal is present, hold register 9 holds the amount of attenuation of the variable attenuator at its most recent previous level in readiness for the next burst of transmission. This allows transmission bursts to be stably handled.

Figure 2:
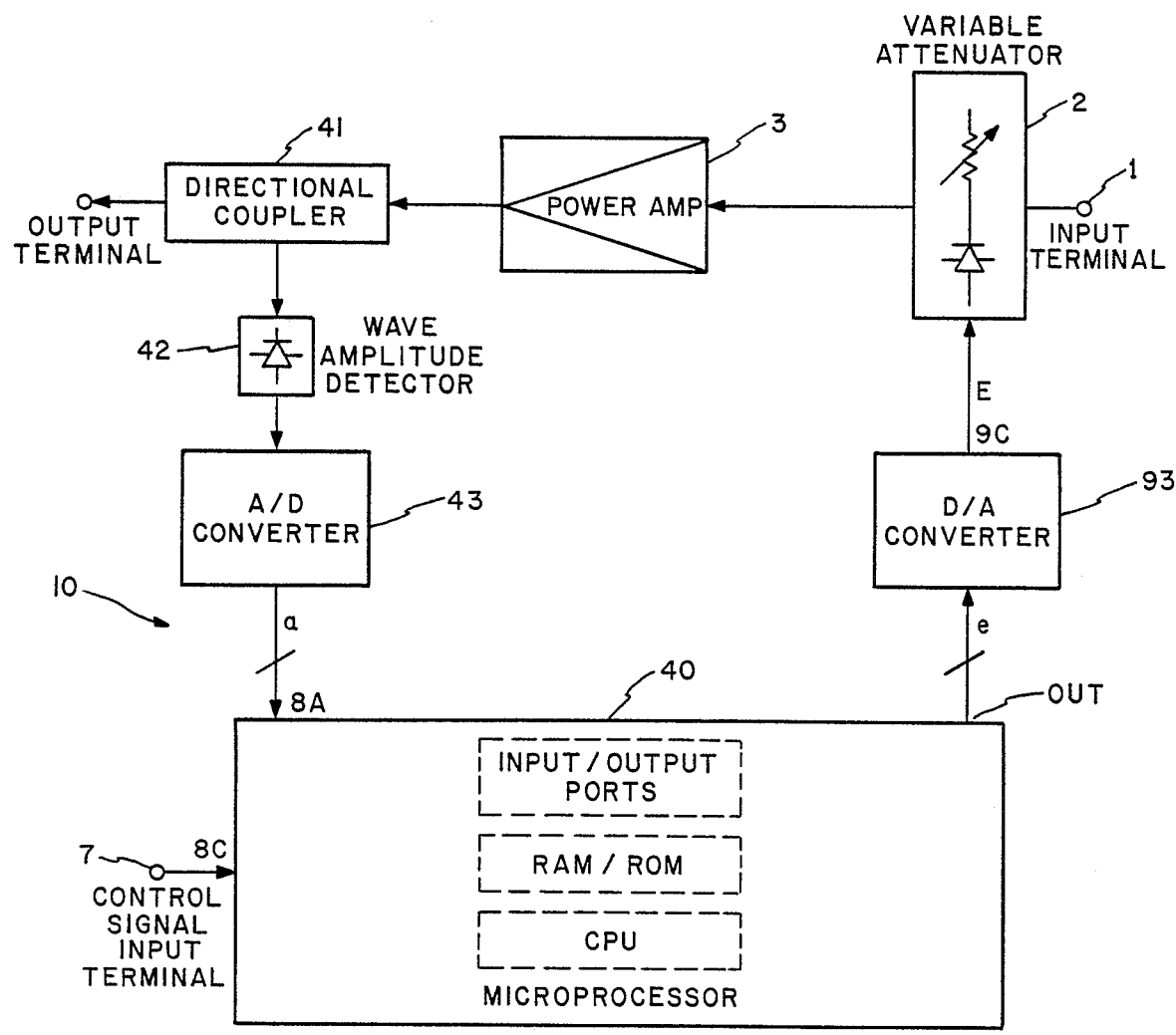
FIG. 2 is a functional block diagram showing a hybrid analog-digital circuit in which certain portions of the control circuit of FIG. 1 are realized by use of a programmed microprocessor chip.

Among the components of control circuit 10, variable attenuator 2, power amplifier 3, directional coupler 41, wave amplitude detector 42, A/D converter 43, and D/A converter 93 can be realized by analog component circuitry. As shown in FIG. 2, the digital signal processing circuits, such as digital comparator 6, digital error detector 8, and digital attenuator controller 9 (except D/A converter 93) can be conveniently realized by commercially available microprocessor technology, such as a microprocessor on a chip, with on board read only memory (ROM) and random access memory (RAM) if desired. Therefore, the automatic power control circuit 10 of this invention can be configured around such a microprocessor chip 40. If desired, microprocessor chips 40 are available that would even include on board the A/D converter 43 and D/A converter 93.

Figure 3:
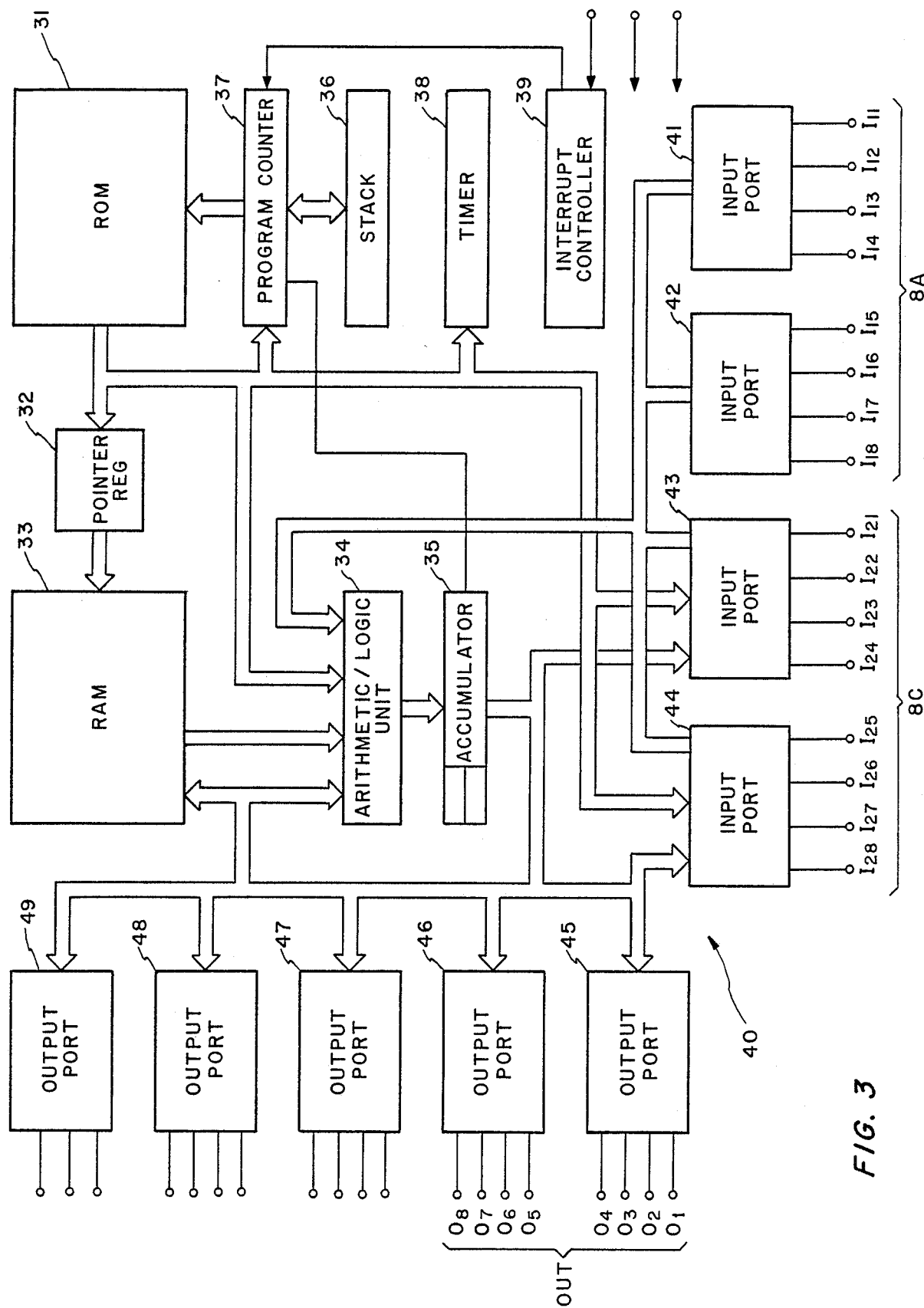
FIG. 3 is a detailed functional block diagram of the microprocessor chip shown in FIG. 2.

FIG. 3 illustrates an example of microprocessor chip 40 of FIG. 2 that can be used for the digital functions in the inventive automatic control circuit. The microprocessor chip 40 has a ROM memory 31 for storing its control program, a RAM memory 33 for storing work in progress, an arithmetic/logic unit (ALU) 34, an accumulator 35 that includes carry and carry escape flip-flops, a stack 36, a program counter 37, and a timer 38. Also included are interrupt controller 39, input ports 41-44, and output ports 45-49. FIG. 3 also shows the relationship between ports 41-46 and the corresponding inputs 8A, 8C and output OUT of the microprocessor chip 40 as it appears in FIG. 2.

Since the configuration and operation of such commercially available programmable microprocessor chips are well known, they will not be discussed in further detail here.

Figure 4:
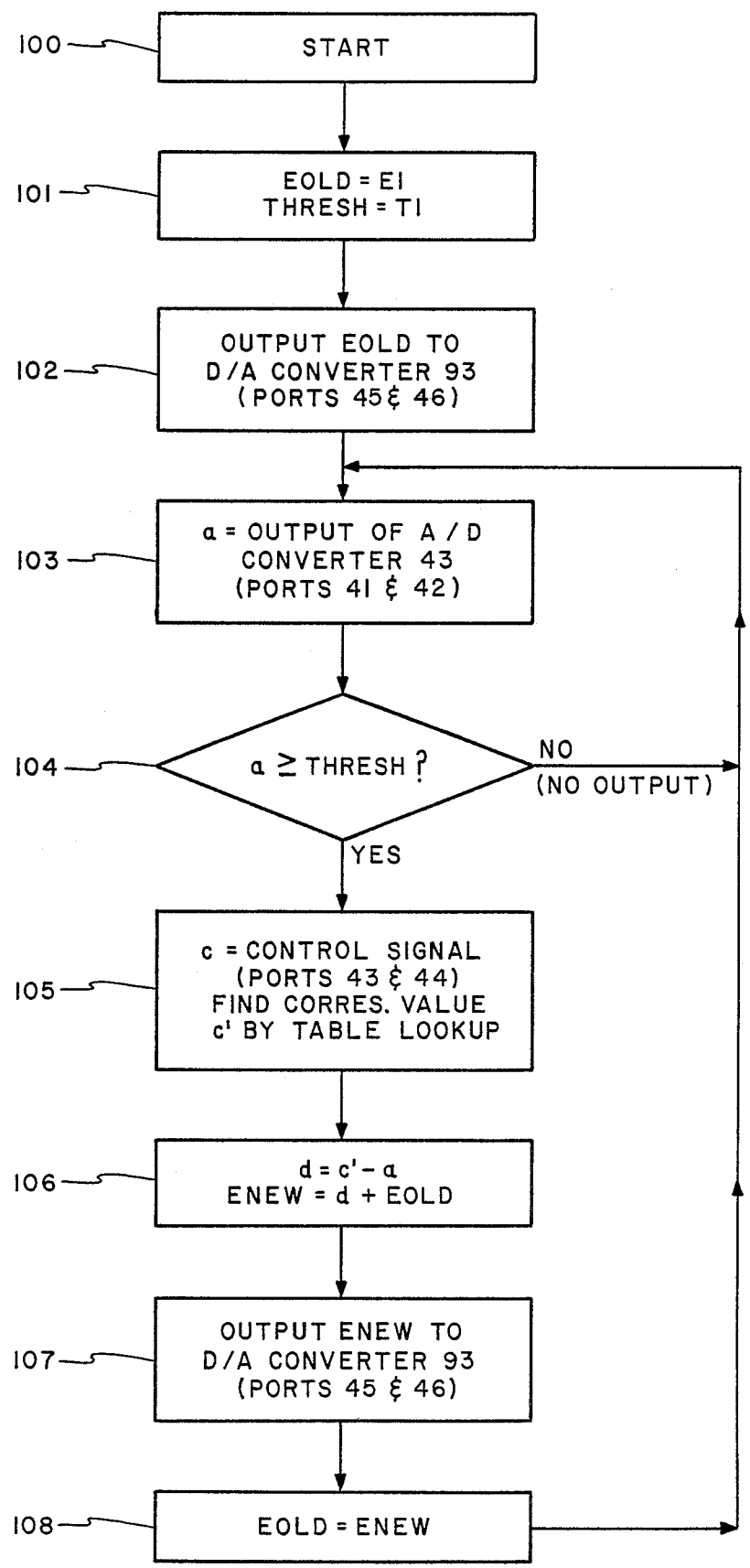
FIG. 4 is a flow diagram of a procedure which can be programmed and stored for execution in the memory of the microprocessor chip of FIG. 2.

A flow diagram showing how the microprocessor can be programmed to execute the functions needed to implement the hybrid analog-digital circuit of FIG. 2 is shown in FIG. 4. The procedure Starts at Step 100 and at Step 101 the variable EOLD is set to a preselected constant EI which is a preselected initial value for the digital correction signal e of FIGS. 1, IA, and 2. A variable THRESH is set to the preselected constant TI, the desired digital output power threshold reference used by comparator 6.

At Step 102 the value of EOLD is output to microcomputer ports 45 and 46 (see FIG. 3). Together these two ports have 8 bits, so the preselected initial value of correction signal e is read out at terminal OUT with 8 bit accuracy to D/A converter 93.

Then at Step 103 a digital value read from ports 41 and 42 is given to a variable "a". Since ports 41 and 42 together read in an 8 bit value from A/D converter 43, the digital variable "a" is the measured digital power output signal generated by power level detector 4.

A comparison of variable "a" with the preselected power threshold reference represented by THRESH. If a is greater than or equal to THRESH, this is taken to mean that "Yes, an input communication signal is present at the control circuit's input terminal 1" (see FIGS. 1, 1A, and 2); then Step 105 is next.

Next at Step 105 a digital value is read from ports 43 and 44 and given to a variable c. Since ports 43 and 44 together read in an 8 bit value from control signal input terminal 7, the digital variable c is just the coded external control signal. Step 105 also includes a table look up, using a prestored decoding table, to determine the value of a variable c' from c. This table look up corresponds to the code conversion carried out by code converter 82 of FIG. 1. Thus, the variable c' is the decoded signal representing the desired output power level indicated by external control signal c.

At Step 106 the variable d is computed according to the expression $d = c' - a$. This makes variable d the error signal calculated by subtractor 81 of FIG. 1. Step 106 also includes the operation of setting a variable ENEW by means of the expression $ENEW = d + EOLD$. The variable ENEW then corresponds to the sum s calculated by adder 91 of FIG. 1.

When the variable ENEW is read out to ports 45 and 46 at Step 107, its value (effectively the signal e) is transferred to D/A converter 93, which converts the value of ENEW into the correction signal E for controlling variable attenuator 2.

At Step 108 the variable EOLD is set equal to ENEW in preparation for the next time Step 106 is executed, since by that time what has just been calculated as ENEW will be the "old value" of e.

Now, suppose instead at Step 104 it is found that $a < THRESH$. This is taken to mean that "No, an input communication signal is not present at input terminal 1," in which case there is a loop back to Step 103 to read a new value from A/D converter 43. This is equivalent to the holding function of hold register 92 of FIG. 1, since the value of ENEW (and hence the value e output to D/A converter 93) remains unchanged.

By following the procedure of FIG. 4, microprocessor chip 40 is enabled to carry out the functions of comparator 6, error detector 8, and attenuator 9 (except for the D/A conversion of converter 93).

Thus, the microprocessor-based automatic power control circuit 10 of this invention has a negative feedback loop that, when there is a signal input at terminal 1, decodes the external power output signal c input at terminal 7 and compares it (as decoded signal c') with a measurement "a" of the actual output of power amplifier 3. Any difference is integrated: If the power amplifier output is greater, the control circuit increases the amount of attenuation of variable attenuator 2. If the power output is less, the amount of attenuation of variable attenuator 2 is reduced.

If the input signal temporarily ceases, the variable attenuator is kept at the most recent attenuation value before the signal input ceased. Input 7 enables the power output to be externally set. In addition, the power control circuit not only performs common amplification of multiple carrier signals but also stably amplifies the burst transmissions of packet signals. It maintains precise control over the level of power output. And, because a majority of the feedback loop components perform digital processing, these important functions can easily be carried out by a single tiny microprocessor, greatly reducing the cost and size of the circuit. Thus, the invention provides a precision automatic power control circuit particularly useful for use in small ground stations.

While the principles of the invention have been described above in connection with specific apparatus and applications, it is to be understood that this description is made only by way of example and not as a limitation on the scope of the invention.

We claim:

1. An automatic power control circuit comprising:
    variable attenuator means disposed ahead of a power amplifier for variably setting the amount of attenuation of an input signal for the power amplifier;
    power detection means for detecting a portion of the output from the power amplifier and for generating a power output signal corresponding to the power output level of the power amplifier;
    comparison means for comparing the magnitude of the power output signal against a predetermined threshold value and for generating a decision signal based on said comparison indicating the presence or absence of power output from the power amplifier;
    error detection means for detecting the difference between control data from an external power output control signal and the power output signal from the detection means and generating an error signal corresponding to said difference;
    attenuator control means for integrating the error signal and generating an integrated correction value when the decision signal indicates the presence of power output from the power amplifier, and for generating the most recent prior integrated correction value when the decision signal indicates the absence of power output from the power amplifier; and
    means for transmitting said integrated correction value as a control signal to the variable attenuator.

2. The automatic power control circuit of claim 1 wherein power detection means outputs the power output signal as digital data, the control data derived by the error detection means from the external power output control signal is digital control data and the error signal it generates is a digital signal, and the attenuator control means digitally integrates the error signal.

3. The automatic power control circuit of claim 1 wherein the comparison means, error detection means, and attenuator control means include a common microprocessor means for performing their functions.

4. A power control circuit comprising:
    an amplifying transmission path having an input for a communication signal, an output for an amplified version of the communication signal, an external control input for an external power control signal, and a controllable variable attenuation means in the amplifying transmission path for regulating the power of the amplified communication signal;
    reference means for generating a first signal representing a predetermined minimum power at the output when the communication signal fed to the input is nonzero, and detector means coupled to the transmission path for generating a second signal representing the actual power at the output, and comparison means responsive to the first and second signals for indicating their relative size by generating a third signal;

error means coupled to the power detector and the external control input and responsive to the second signal and the external power control signal for generating a fourth signal proportional to their difference; and controller means responsive to the third and fourth signals for generating a fifth signal for negative feedback control of the variable attenuator means, the fifth signal being proportional to the integral of the fourth signal only when the third signal indicates that the second signal is equal to or greater than the first signal, and otherwise being held constant at its most recent value.

5. The power control circuit of claim 4 wherein the amplifying transmission path includes a power amplifier and the controllable variable attenuation means is disposed in the transmission path ahead of the power amplifier.

6. The power control circuit of claim 5 wherein the first, second, and third signals respectively generated by the reference means, detector means, and comparison means are digital signals.

7. The power control circuit of claim 6 wherein the fourth and fifth signals respectively generated by the error means and controller means are also digital signals, and the controller means includes means for converting the fifth signal to an analog signal for feedback to the variable attenuator means.

8. The power control circuit of claim 6 wherein the reference means, detector means, and comparison means include a common microprocessor means for performing their functions.

9. The power control circuit of claim 7 wherein the reference means, detector means, comparison means, error means, and controller means include a common microprocessor for performing their functions.

* * * * *